United States Patent
Lin et al.

(10) Patent No.: US 9,953,880 B1
(45) Date of Patent: Apr. 24, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Hao Lin, Kaohsiung (TW); Hsin-yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/660,991

(22) Filed: Jul. 27, 2017

(30) Foreign Application Priority Data

Jun. 29, 2017 (CN) .......................... 2017 1 0516576

(51) Int. Cl.
*H01L 29/76* (2006.01)
*H01L 21/8234* (2006.01)
*H01L 21/762* (2006.01)
*H01L 29/66* (2006.01)
*H01L 21/311* (2006.01)

(52) U.S. Cl.
CPC .............. *H01L 21/823481* (2013.01); *H01L 21/31144* (2013.01); *H01L 21/76224* (2013.01); *H01L 21/823475* (2013.01); *H01L 29/66545* (2013.01); *H01L 29/66795* (2013.01)

(58) Field of Classification Search
CPC ..... H01L 21/823431; H01L 21/823437; H01L 21/823481; H01L 21/308; H01L 21/31051; H01L 21/31144; H01L 29/66545; H01L 21/76224; H01L 21/823475; H01L 29/66795; H01L 27/11807; H01L 29/0642
USPC ......... 257/288, 368, 369; 438/151, 197, 199
See application file for complete search history.

(56) References Cited

U.S. PATENT DOCUMENTS

| | | | |
|---|---|---|---|
| 8,502,316 B2 | 8/2013 | Fung et al. | |
| 8,609,510 B1 * | 12/2013 | Banna | H01L 29/66545 |
| | | | 257/E21.409 |
| 9,368,496 B1 * | 6/2016 | Yu | H01L 27/0886 |
| 9,524,911 B1 * | 12/2016 | Tsai | H01L 29/401 |
| 2014/0027820 A1 | 1/2014 | Aquilino et al. | |
| 2017/0243790 A1 * | 8/2017 | Xie | H01L 21/823431 |
| 2017/0287933 A1 * | 10/2017 | Chen | H01L 27/11807 |

* cited by examiner

*Primary Examiner* — Shahed Ahmed
(74) *Attorney, Agent, or Firm* — Winston Hsu

(57) ABSTRACT

A method for fabricating semiconductor device includes the steps of: forming a fin-shaped structure on a substrate; forming a shallow trench isolation (STI) around the fin-shaped structure; forming a gate layer on the fin-shaped structure and the STI; removing part of the gate layer, part of the fin-shaped structure, and part of the STI to form a trench; and forming a dielectric layer into the trench to form a single diffusion break (SDB) structure.

12 Claims, 5 Drawing Sheets

FIG. 10

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a fin-shaped structure on a substrate; forming a shallow trench isolation (STI) around the fin-shaped structure; forming a gate layer on the fin-shaped structure and the STI; removing part of the gate layer, part of the fin-shaped structure, and part of the STI to form a trench; and forming a dielectric layer into the trench to form a single diffusion break (SDB) structure.

According to another aspect of the present invention, a semiconductor device includes: a fin-shaped structure on a substrate; a single diffusion break (SDB) structure in the fin-shaped structure to divide the fin-shaped structure into a first portion and a second portion; a gate structure on the first portion; and a contact etch stop layer (CESL) adjacent to the gate structure and extending to cover the SDB structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
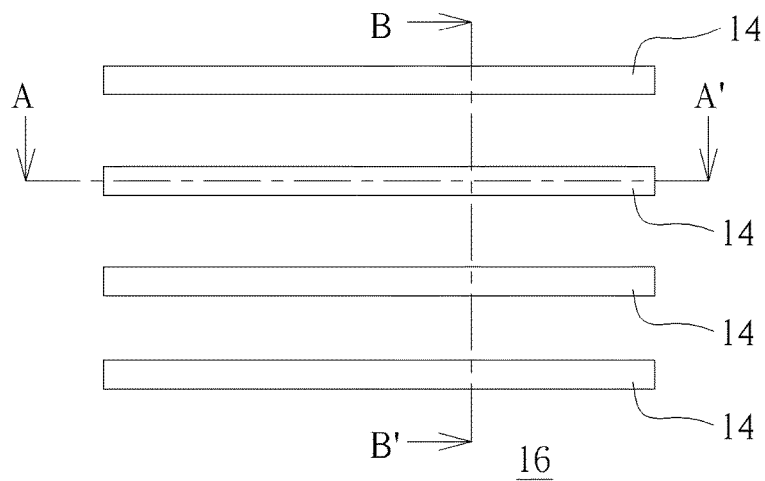
FIGS. 1-10 illustrate a method for fabricating a semiconductor device according to an embodiment of the present invention.
Figure 2:
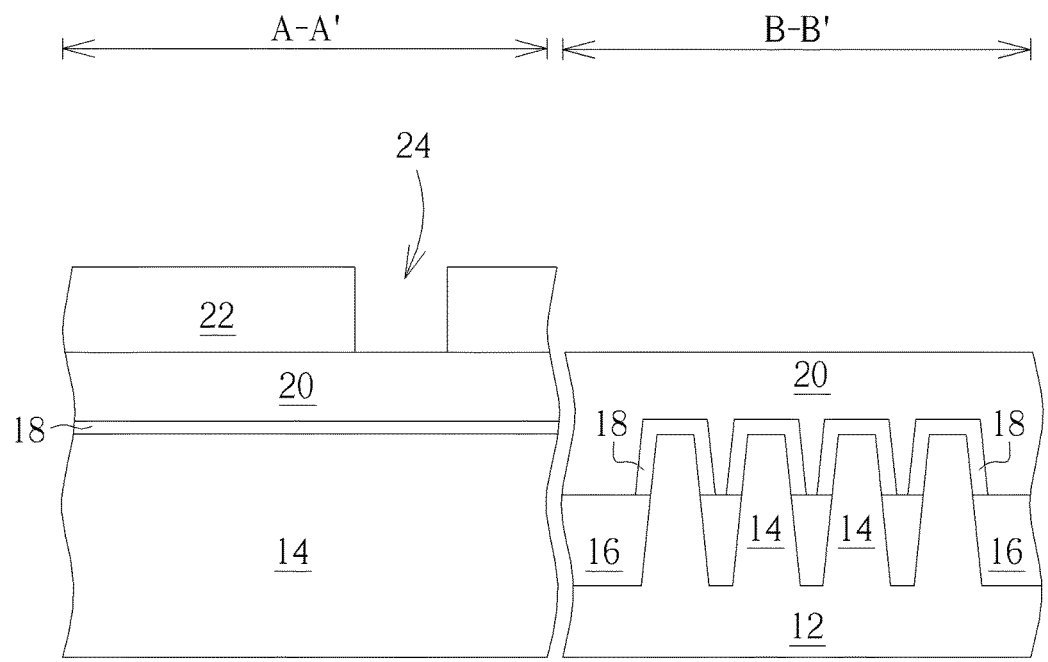

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, and a plurality of fin-shaped structures 14 are formed on the substrate 12. It should be noted that even though four fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 16 is formed around the fin-shaped structures 14. In this embodiment, the formation of the STI 16 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is even with or slightly lower than the top surface of the fin-shaped structures 14 for forming the STI 16.

Next, agate dielectric layer 18 and a gate layer 20 are formed to cover the fin-shaped structures 14 and the STI 16 entirely, and a patterned mask 22 is formed on the gate layer 20, in which the patterned mask 22 includes an opening 24 to expose part of the gate layer 20 surface. In this embodiment, the gate dielectric layer 18 preferably includes silicon oxide and the gate layer 20 is selected from the group consisting of amorphous silicon and polysilicon. The patterned mask 22 could additionally include an organic dielectric layer (ODL), a silicon-containing hard mask bottom anti-reflective coating (SHB), and a patterned resist and the step of forming the opening 24 in the patterned mask 22 could be accomplished by using the patterned resist as mask to remove part of the SHB and part of the ODL.

Figure 3:
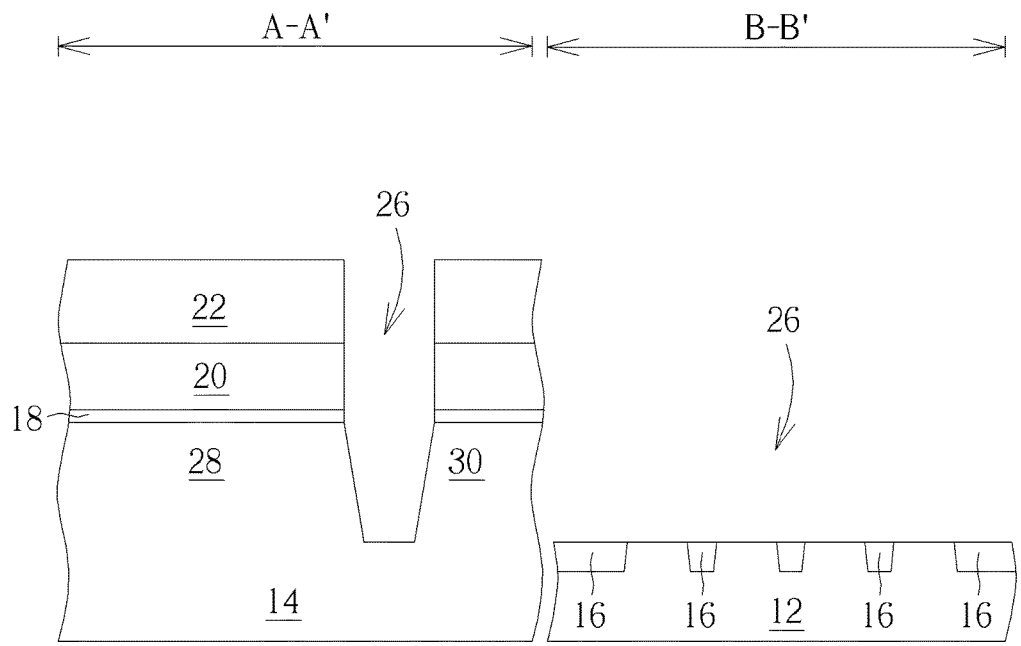

Next, as shown in FIG. 3, an etching process is conducted by using the patterned mask 22 as mask to remove part of the gate layer 20, part of the gate dielectric layer 18, and part of the fin-shaped structures 14 to form a trench 26. The trench 26 preferably divides the fin-shaped structures 14 into two portions including a first portion 28 on the left side of the trench 26 and a second portion 30 on the right side of the trench 26.

Figure 4:
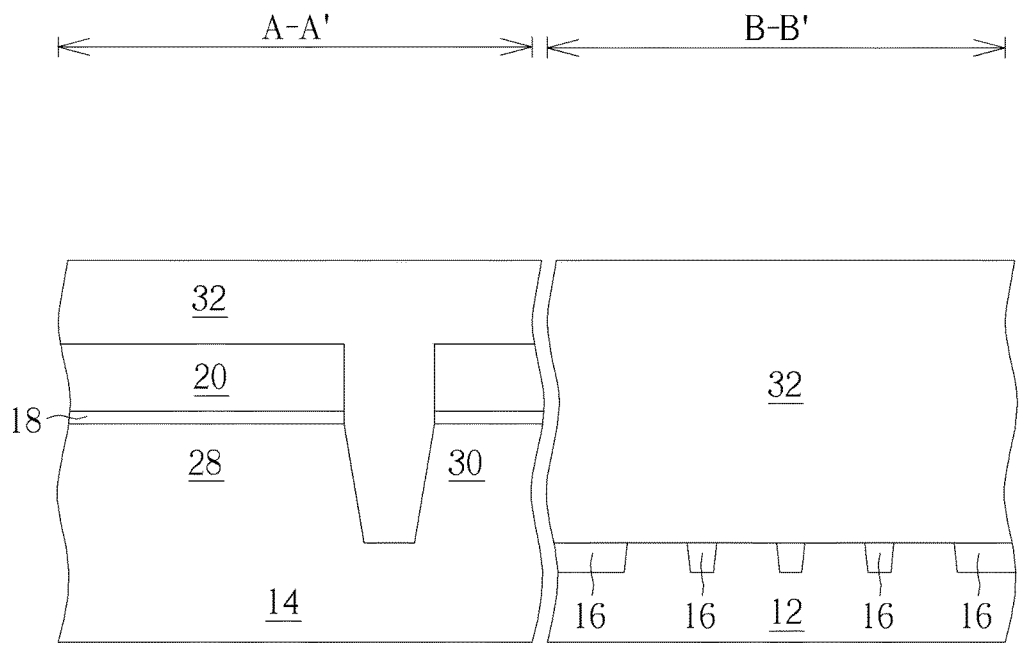

Next, as shown in FIG. 4, a planar dielectric layer 32 is formed into the trench 26 and on the gate layer 20, in which the dielectric layer 32 preferably fills the trench 26 entirely so that the top surface of the dielectric layer 32 is slightly higher than the top surface of the gate layer 20. In this embodiment, the dielectric layer 32 and the STI 16 are preferably made of different material, in which the dielectric layer 32 filled into the trench 26 preferably includes silicon nitride while the STI 16 preferably includes silicon oxide, but not limited thereto. Nevertheless, according to an embodiment of the present invention, the dielectric layer 32 and the STI 16 could also include same material such as silicon oxide, which is also within the scope of the present invention.

Figure 5:
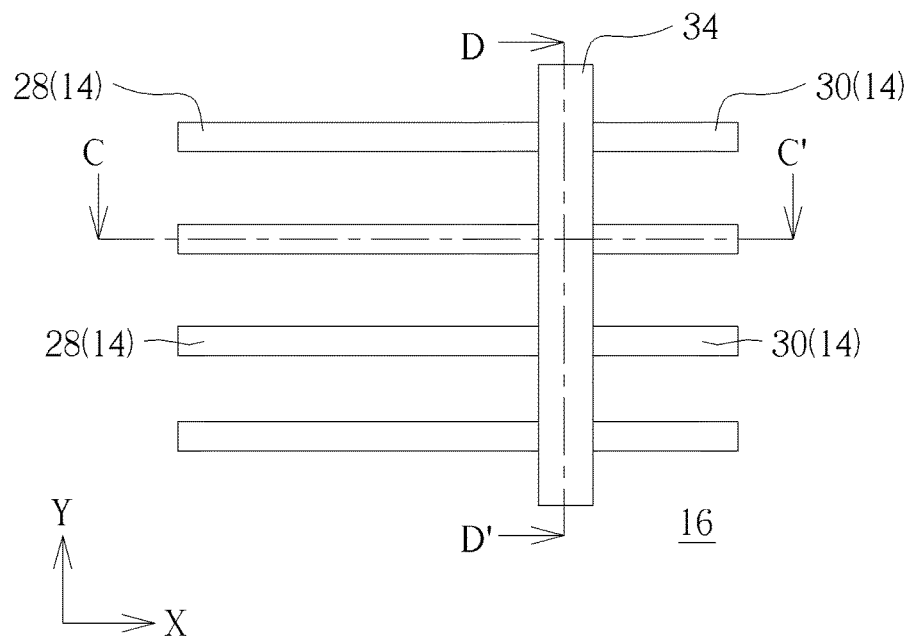
Figure 6:
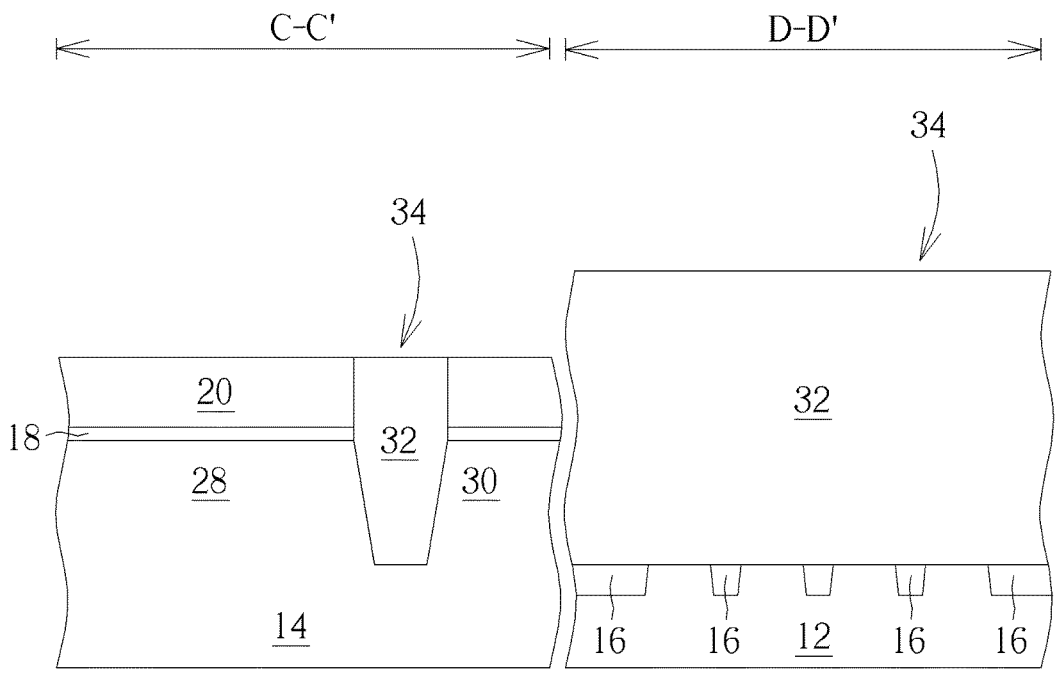

Referring to FIGS. 5-6, in which FIG. 5 is a top view illustrating the fabrication of the semiconductor device following FIG. 4, the left portion of FIG. 6 illustrates a cross-sectional view of FIG. 5 along the sectional line CC' and the right portion of FIG. 6 illustrates a cross-sectional view of FIG. 5 along the sectional line DD'. As shown in FIGS. 5-6, a planarizing process such as CMP is conducted to remove part of the dielectric layer 32 so that the top surface of the remaining dielectric layer 32 is even with the top surface of the gate layer 20. This forms a single diffusion break (SDB) structure 34 protruding above the fin-shaped structures 14, in which the top surfaces of the SDB structure 32 and the gate layer 20 are coplanar. As shown in FIG. 5, the fin-shaped structures 14 are disposed extending along a first direction (such as X-direction) and the SDB structure 34 is disposed extending along a second direction (such as Y-direction), in which the SDB structure 34 preferably separates each of the fin-shaped structures into two portions, including a first portion 28 on the left side of the SDB structure 34 and a second portion 30 on the right side of the SDB structure 34.

Figure 7:
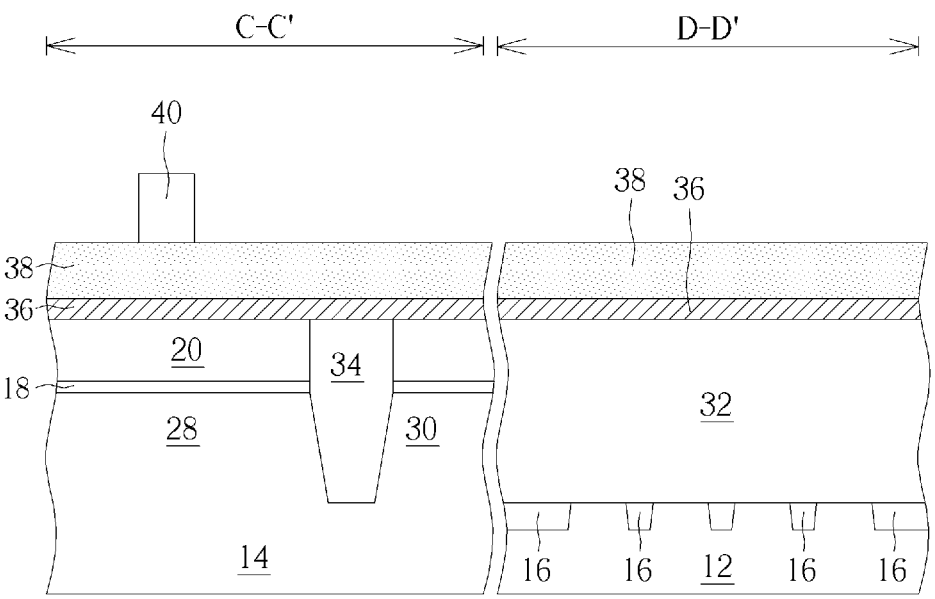

Next, as shown in FIG. 7, a pattern transfer process is conducted by first forming a first hard mask 36, a second hard mask 38, and a patterned mask 40 on the gate layer 20 while the patterned mask 40 not covering the SDB structure 34. In this embodiment, the first hard mask 36 and the second hard mask 38 are composed of different material, in which the first had mask 36 preferably includes silicon nitride and the second hard mask 38 preferably includes silicon oxide, but not limited thereto. The patterned hard mask 40 could be a single patterned resist or could be made of same material as the patterned mask 22 from FIG. 2, and in such instance, the patterned mask 40 could include a tri-layered structure such as an organic dielectric layer (ODL), a silicon-containing hard mask bottom anti-reflective coating (SHB), and a patterned resist.

Figure 8:
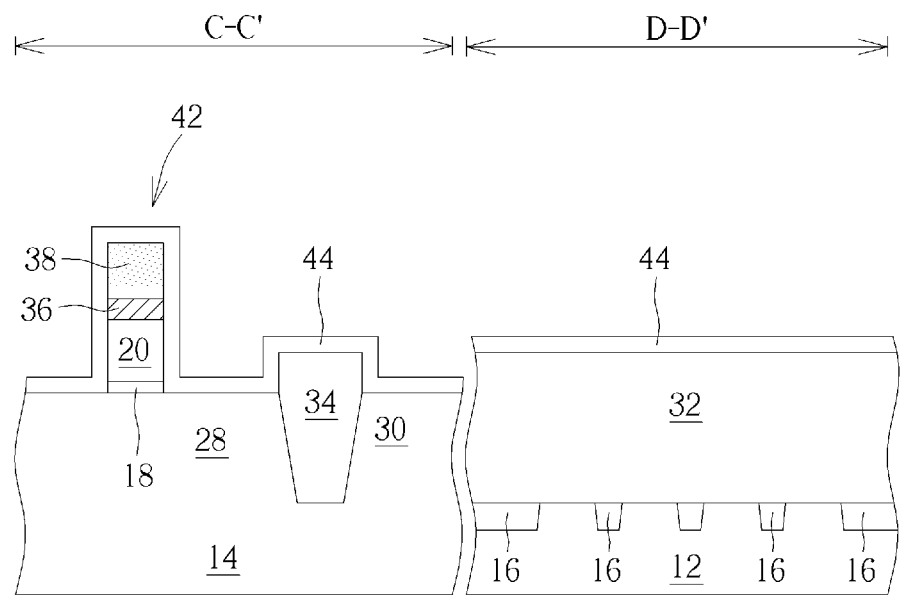

Next, as shown in FIG. 8, one or multiple etching processes are conducted by using the patterned mask 40 as mask to remove part of the second hard mask 38, part of the first hard mask 36, part of the gate layer 20, and part of the gate dielectric layer 18 to form a gate structure 42 adjacent to the SDB structure 34. It should be noted that no additional gate structure is formed directly on top of the SDB structure 34 during the formation of gate structure 42, however, dummy gate (not shown) could be disposed on an edge of the fin-shaped structures 14 to stand on top of both the fin-shaped structures 14 and the STI 16 at the same time, in which the top surface of the dummy gate is even with the top surface of the gate structure 42. Preferably, the top surface of the STI 16 is slightly lower than the top surface of the fin-shaped structure 14 while the top surface of the SDB structure 34 is higher than both the top surface of the fin-shaped structures 14 and the STI 16. Moreover, the height of the SDB 34 protruding above the fin-shaped structures 14 is reduced slightly during the etching process so that the top surface of the SDB 34 would become slightly lower than the top surface of the gate layer 20. Next, a cap layer 44 is formed on the fin-shaped structures 14 to cover the gate structure 42 and the SDB structure 34 at the same time. In this embodiment, the cap layer 44 could include material such as SiN, $SiO_2$, SiON, SiCN, or combination thereof.

Figure 9:
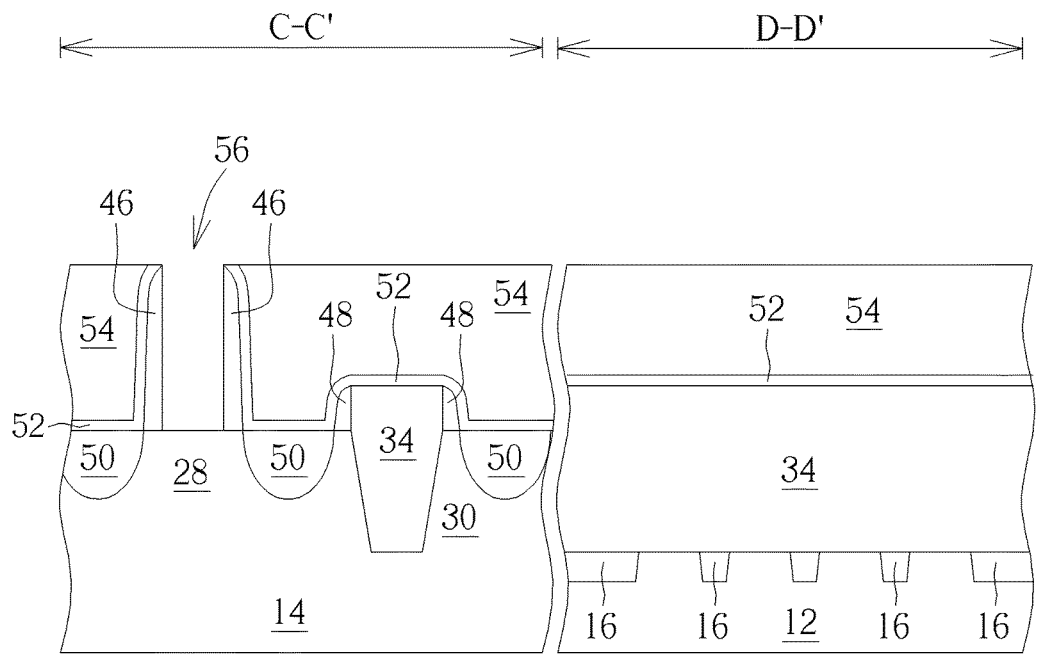

Next, as shown in FIG. 9, an etching process is conducted to remove part of the cap layer 44 for forming a first spacer 46 adjacent to the sidewalls of the gate structure 42 and at the same time forming a second spacer 48 on the sidewalls of the SDB structure 34. Next, source/drain regions 50 and/or epitaxial layers (not shown) are formed in the fin-shaped structures 14 adjacent to two sides of the first spacer 46 and second spacer 48, and silicides (not shown) could be selectively formed on the surface of the source/drain regions 50 and/or epitaxial layers afterwards. In this embodiment, each of the first spacer 46 and second spacer 48 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 50 could include dopants and epitaxial material of different conductive type depending on the type of device being fabricated. For example, the source/drain regions 50 on an NMOS region could include SiC or SiP while the source/drain regions 50 on an PMOS region could include SiGe, but not limited thereto.

Next, a contact etch stop layer (CESL) 52 is formed on the surface of the fin-shaped structures 14 and covering the gate structure 42 and the SDB structure 34, and an interlayer dielectric (ILD) layer 54 is formed on the CESL 52. Next, a planarizing process such as CMP is conducted to remove part of the ILD layer 54 and part of the CESL 52 for exposing the gate layer 20 made of polysilicon, in which the top surface of the gate layer 20 is even with the top surface of the ILD layer 52.

Next, a replacement metal gate (RMG) process is conducted to transform the gate structure 42 into a metal gate. For instance, the RMG process could be accomplished by first performing a selective dry etching or wet etching process using etchants including but not limited to for example ammonium hydroxide (NH$_4$OH) or tetramethylammonium hydroxide (TMAH) to remove the second hard mask 38, first hard mask 36, gate layer 20, and even gate dielectric layer 18 from gate structure 42 for forming a recess 56 in the ILD layer 54.

Figure 10:
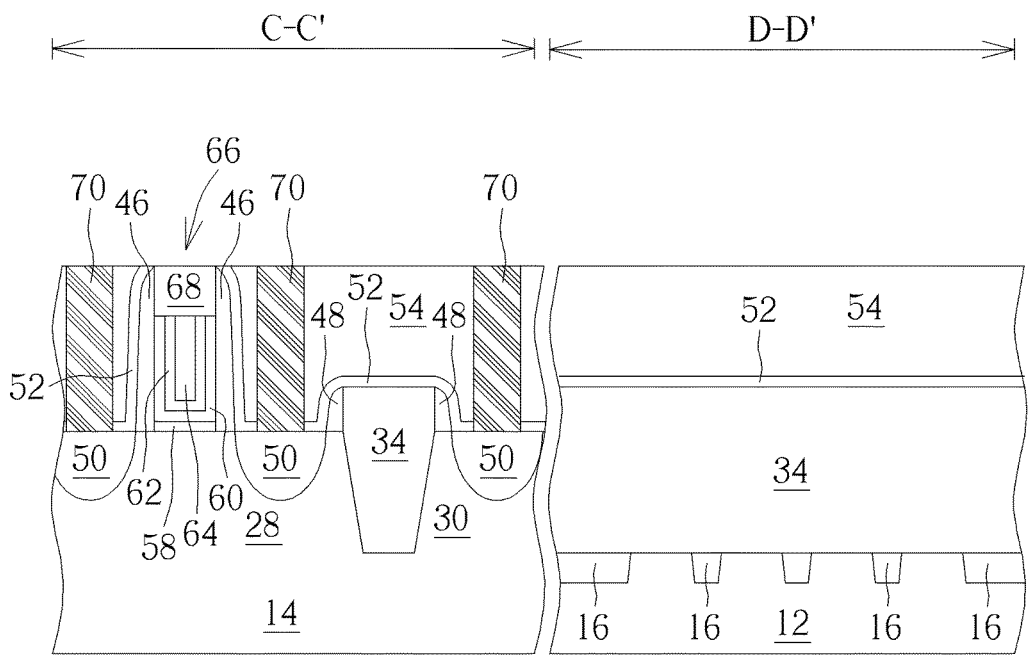

Next, as shown in FIG. 10, a selective interfacial layer 58 or gate dielectric layer (not shown), a high-k dielectric layer 60, a work function metal layer 62, and a low resistance metal layer 64 are formed in the recess 56, and a planarizing process such as CMP is conducted to remove part of low resistance metal layer 64, part of work function metal layer 62, and part of high-k dielectric layer 60 to form metal gate 66. Next, part of the low resistance metal layer 64, part of the work function metal layer 62, and part of the high-k dielectric layer 60 are removed to form another recess (not shown), and a hard mask 68 made of dielectric material including but not limited to for example silicon nitride is deposited into the recess so that the top surfaces of the hard mask 68 and ILD layer 54 are coplanar. In this embodiment, the gate structure or metal gate 66 fabricated through high-k last process of a gate last process preferably includes an interfacial layer 58 or gate dielectric layer (not shown), a U-shaped high-k dielectric layer 60, a U-shaped work function metal layer 62, and a low resistance metal layer 64.

In this embodiment, the high-k dielectric layer 60 is preferably selected from dielectric materials having dielectric constant (k value) larger than 4. For instance, the high-k dielectric layer 60 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 62 is formed for tuning the work function of the metal gate in accordance with the conductivity of the device. For an NMOS transistor, the work function metal layer 62 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 62 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 62 and the low resistance metal layer 64, in which the material of the barrier layer may include titanium (Ti), titanium nitride (TiN), tantalum (Ta) or tantalum nitride (TaN). Furthermore, the material of the low-resistance metal layer 64 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 54 adjacent to the metal gate 66 and SDB structure 34 for forming contact holes (not shown) exposing the source/drain regions 50 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 70 electrically connecting the source/drain regions 50. This completes the fabrication of a semiconductor device according to a preferred embodiment of the present invention.

Referring again to FIG. 10, which further illustrates a structural view of a semiconductor device according to an embodiment of the present invention. As shown in FIG. 10, the semiconductor device preferably includes a fin-shaped structure 14 disposed on the substrate 12, a SDB structure 34 disposed within the fin-shaped structure 14 while protruding above the fin-shaped structure 14 and dividing the fin-shaped structure 14 into a first portion 28 and a second portion 30, and a gate structure or metal gate 66 disposed on the first portion 28. Preferably, the top surface of the metal gate 66 is even with or slightly higher than the top surface of the SDB structure 34, the fin-shaped structure 14 is disposed extending along a first direction while the SDB structure 34 is disposed extending along a second direction, in which the first direction is orthogonal to the second direction as shown in FIG. 5.

The semiconductor device also includes a first spacer 46 on the sidewalls of the metal gate 66, a second spacer 48 on the sidewalls of the SDB structure 34, a CESL 52 disposed adjacent to the first spacer 46 and extending to cover the second spacer 48 and SDB structure 34 while contacting the SDB structure 34 directly, and source/drain regions 50 disposed in the fin-shaped structure 14 adjacent to two sides of the first spacer 46 and second spacer 48.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a fin-shaped structure on a substrate;
    forming a shallow trench isolation (STI) around the fin-shaped structure;
    forming a gate layer on the fin-shaped structure and the STI;
    removing part of the gate layer, part of the fin-shaped structure, and part of the STI to form a trench;
    forming a dielectric layer into the trench to form a single diffusion break (SDB) structure; and
    after forming the SDB structure forming an interlayer dielectric (ILD) layer on the SDB structure.

2. The method of claim 1, further comprising forming a gate dielectric layer on the fin-shaped structure before forming the gate layer.

3. The method of claim 2, further comprising:
    forming a patterned mask on the gate layer; and
    using the patterned mask as mask to remove part of the gate layer, part of the gate dielectric layer, and part of the fin-shaped structure to form the trench.

4. The method of claim 1, further comprising:
    forming the dielectric layer into the trench and on the gate layer; and planarizing the dielectric layer so that the top surfaces of the dielectric layer and the gate layer are coplanar.

5. The method of claim 1, further comprising removing part of the gate layer after forming the SDB structure to form a gate structure adjacent to the SDB structure.

6. The method of claim 5, further comprising:
forming a cap layer on the gate structure and the SDB structure; and
removing part of the cap layer to form a first spacer adjacent to the gate structure and a second spacer adjacent to the SDB structure.

7. The method of claim 1, wherein the fin-shaped structure is disposed extending along a first direction and the SDB structure is disposed extending along a second direction.

8. The method of claim 7, wherein the first direction is orthogonal to the second direction.

9. The method of claim 1, wherein the gate layer comprises amorphous silicon.

10. The method of claim 1, wherein the gate layer comprises polysilicon.

11. The method of claim 1, wherein the dielectric layer comprises silicon nitride.

12. The method of claim 1, wherein the dielectric layer comprises silicon oxide.

* * * * *